(12) United States Patent
Holmqvist (10) Patent No.: US 7,676,713 B2
(45) Date of Patent: Mar. 9, 2010

(54) AUTOMATED DEVICE TESTING USING INTERTWINED STIMULUS-GENERATION AND RESPONSE VALIDATION SPECIFICATIONS FOR MANAGING DUT'S THAT GENERATE OUT-OF-ORDER RESPONSES

(75) Inventor: Ryan Holmqvist, Basking Ridge, NJ (US)

(73) Assignee: Integrated Device Technology, Inc., San Jose, CA (US)

( * ) Notice: Subject to any disclaimer, the term of this patent is extended or adjusted under 35 U.S.C. 154(b) by 528 days.

(21) Appl. No.: 11/261,256

(22) Filed: Oct. 28, 2005

(65) Prior Publication Data

US 2007/0101215 A1 May 3, 2007

(51) Int. Cl.
*G01R 31/28* (2006.01)
*G06F 11/00* (2006.01)
(52) U.S. Cl. .................. 714/724; 714/32; 714/37; 714/735; 714/736; 714/742
(58) Field of Classification Search .............. 714/724, 714/32, 37, 735, 736, 742
See application file for complete search history.

(56) References Cited

U.S. PATENT DOCUMENTS

| 7,241,538 | B2 | 7/2007 | Zhang et al. | |
|---|---|---|---|---|
| 2003/0088664 | A1* | 5/2003 | Hannel et al. | 709/224 |
| 2003/0172177 | A1* | 9/2003 | Kersley et al. | 709/236 |
| 2003/0217341 | A1* | 11/2003 | Rajsuman et al. | 716/4 |
| 2005/0005198 | A1* | 1/2005 | Vakrat et al. | 714/37 |
| 2007/0118677 | A1* | 5/2007 | Swartzentruber et al. | 710/316 |

* cited by examiner

*Primary Examiner*—John J Tabone, Jr.
(74) *Attorney, Agent, or Firm*—Tracy Parris

(57) ABSTRACT

An intertwined test specification (ITTS) is used for controlling Automated Test Equipment (ATE) to apply a sequence of stimulus signals to a device under test (DUT) during a stimulus run and to validate returned response signals during a validation run. The ITTS has response validation scripts intertwined with stimulus invoking scripts where the response validation scripts are conditionally executed during the validation run but not during the stimulus invoking run. Response signals are logically associated with unique stimulus identification codes so that appropriate response signals can be matched with corresponding validation scripts even if the response signals are returned out-of-order to the ATE or to a response logging unit interposed between the ATE and the DUT.

38 Claims, 5 Drawing Sheets

Fig. 5

Fig. 6A PCI-express TLP Header (Stimulus Packet for Register Read Operation)

Fig. 6B

AUTOMATED DEVICE TESTING USING INTERTWINED STIMULUS-GENERATION AND RESPONSE VALIDATION SPECIFICATIONS FOR MANAGING DUT'S THAT GENERATE OUT-OF-ORDER RESPONSES

FIELD OF DISCLOSURE

The present invention relates generally to automated testing of devices where scripts or programs are utilized to define stimuli applied to a Device Under Test (DUT) and to define the correspondingly expected response(s). The disclosure relates more specifically to DUT's that can output responses in an order other than that in which corresponding stimuli were sent.

DESCRIPTION OF RELATED ART

Mass-produced and mass-distributed devices should be fully and well tested before such devices are released into the field for mass usage. Testing may occur in a pre-release production facility and/or it may occur continue to occur, in the field after release.

Examples of mass produced and distributed devices that usually warrant extensive, pre-release testing include monolithic, integrated circuits (IC's) such as those used in continuous-use communication systems and circuit boards (e.g., communication line cards). It is undesirable to have a given device fail surprisingly in the field just when a vital communication or other vital operation is being conducted through the given and surprisingly failing device. Examples of vital communications may include medical emergency related communications and security assurance communications. Examples of surprising failure modes include unexpected buffer overruns or underruns that are not gracefully and/or timely recovered from.

One conventionally known testing method uses a one-after-next pairing of stimuli-invoking and response-analyzing procedures. Because of the one-after-next pairing, it is easy to maintain coherence between outputs of corresponding ones of the invoked stimulus signals and validation of the returned response signals so that a proper validation procedure is run for each of successively received responses. During the first of the paired set of procedures (e.g., a first process call that is carried out by an automated device-testing system or ATE—automated testing equipment), a stimulus operation is defined where the defined operation is to be carried out within and/or outside the DUT (Device Under Test) in order to stimulate the DUT. In an immediately successive, procedure (e.g., a second process call that is also carried out by the ATE), the response generated by the DUT is received and compared against an expected response and an exception is flagged if the actual response does not match the expected result. If the response correctly matches, then the response is said to be validated.

It is not uncommon for users of automated device-testing equipment systems (ATE's) to routinely change or fine tune their test scripts as time passes and industry needs change. A major advantage of the one-after-next stimulate/validate pairing approach is that the response validating procedure can be easily modified at the same time that the adjacent stimulus defining procedure is modified (or vise versa), this being done so that each stimulus definition is correctly matched or harmonized with its corresponding validation definition. Otherwise, a false positive error will probably be reported during response validation.

A major shortcoming of the one-after-next stimulate/validate pairing approach is that time is consumed during the carrying out of each response validating procedure. This can force an undesirable delay between successive stimuli. In such a case, the DUT cannot be tested at full speed with stimuli being applied to the DUT one after the next, at full speed, without delays between the successive stimulus signals. Further aspects of this problem will become clearer when the below detailed drawings are discussed.

Modern monolithic IC's and other testable devices are continuously being designed to run at greater speeds and to carry out ever more complex sets of operations. Such faster/more complex operations should be thoroughly tested. The one-after-next stimulate/validate pairing approach fails to meet this challenge for the reason given above. Moreover, there is another problem. It is not uncommon to see outputs (responses to stimuli) of modern devices emerging from the to-be-tested device (the DUT) in an order different from that in which corresponding inputs (stimuli) were sent to the DUT. Such out-of-order outputting of responses can occur for various reasons. By way of example, in systems where arbitration takes place between contending threads, a later stimulated thread may win priority over an earlier stimulated thread. By way of another example, in systems where error correction takes place, a first response output may be corrupted by a noise burst. The DUT may detect this and responsively output a second copy of the first response signal. In the interim, however, the DUT may output another response signal before the second copy of the first response signal is output. By way of a third example, the sequential order of stimulus signals may become swapped as originally in-order stimulus signals are transmitted to the DUT by way of different packet carrying routes.

Such out-of-order emergence of response signals presents a major problem for the conventional one-after-next stimulate/validate pairing approach.

SUMMARY

Structures and methods may be provided in accordance with the present disclosure of invention for improving over the above-described shortcomings of the conventional one-after-next stimulus/response pairing method of scripted testing.

An automated device testing method in accordance with the present disclosure comprises: (a) first using an intertwined test specification (ITTS) to apply a first plurality of successive stimuli signals to a device under test (DUT); and (b) second using the intertwined test specification (ITTS) to afterward validate a plurality of response signals generated by the DUT in response to said plurality of stimuli signals. In one embodiment, the intertwined test specification (ITTS) is defined as part of a computer readable manufacture to have paired sets of stimulate/validate procedures where the validate procedures are invoked on condition that application to the DUT of the first successive plurality of stimuli signals is not occurring at that time.

An automated device testing system (ATE) in accordance with the present disclosure comprises: (a) a first-run means that uses an intertwined test specification (ITTS) for causing a first successive plurality of stimuli signals to be applied to a device under test (DUT); and (b) a second-run means that uses the intertwined test specification (ITTS) to afterward validate a plurality of response signals generated by the DUT in response to said plurality of stimuli signals. In one embodiment, the intertwined test specification (ITTS) is defined within a computer readable manufacture such as in the form of instruction code stored within the instructable ATE. The ITTS has paired sets of stimulate/validate procedures where the validate procedures are invoked on condition that the ATE is not then causing application of the first successive plurality of stimuli signals to the device under test (DUT).

Other aspects will become apparent from the below detailed description.

BRIEF DESCRIPTION OF THE DRAWINGS

The below detailed description section makes reference to the accompanying drawings, in which.

DETAILED DESCRIPTION

Figure 1:
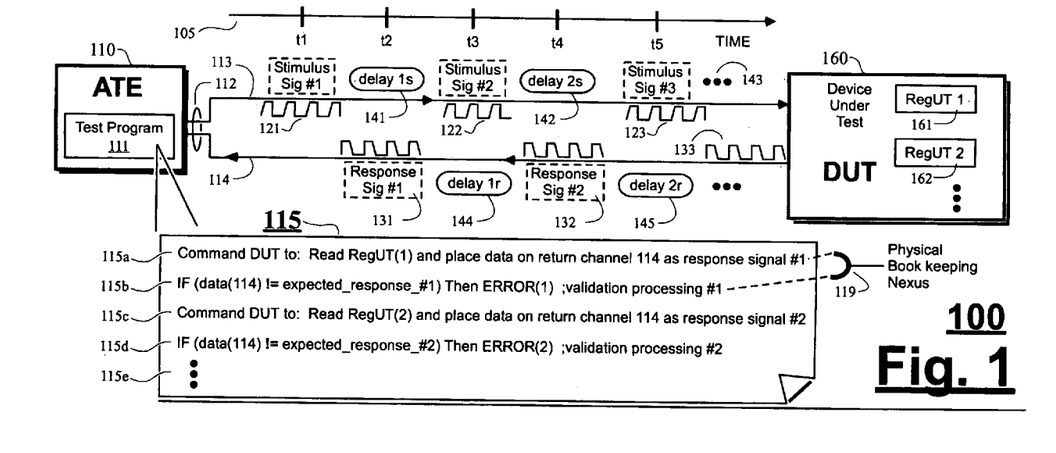
FIG. 1 is a schematic diagram of a conventional ATE setup which uses paired stimulus-invoke and response-validate scripts.

Referring to FIG. 1, a schematic diagram of a conventional ATE setup 100 is shown. System 100 uses paired stimulus-invoke and response-validate scripts, such as the first pair illustrated at 115a and 115b. The Device Under Test (DUT) is shown at 160. A programmed ATE system is shown at 110. A test harness 112 interconnects the ATE 110 with the DUT 160. Respective stimulus-carrying and response-carrying channels, 113 and 114, are defined for carrying corresponding stimulus and response signals through the test harness 112. In one embodiment, the stimulus-carrying and response-carrying channels, 113 and 114, have their own dedicated buses. In an alternate embodiment, a single bidirectional link (e.g., a serial link) within the test harness 112 carries the stimulus and response signals. Signals for the serial version are shown as being carried on separate lines 113 and 114 for enhancing understanding of certain timing issues.

The programmed ATE system 110 includes a recorded test program 111 stored within a memory means of the ATE system. Part of the test program 111 is represented in greater detail as pseudocode section 115 expanded outside of box 110. The illustrated pseudocode section 115 includes the paired stimulus-invoke and response-validate scripts, 115a and 115b, mentioned above. It is understood that the ATE system 110 further includes appropriate data processing means (e.g., an instructable sequencer or microprocessor) for executing the test program 111, for outputting the stimulus signals 113 onto the test harness 112 and for receiving the response signals 114 from the test harness.

A time line 105 is drawn adjacent to the harness channels 113-114 for reference purposes. During a first time period, t1, pseudocode line 115a of the test program 111 is executed by the ATE, thus causing the ATE to send a first DUT-stimulating signal 121 (i.e., a stimulating instruction packet) to the DUT 160 via channel 113. For purpose of illustration it is assumed that the DUT 160 contains a plurality of preloaded registers, including a first under-test register, RegUT(1) as shown at 161 and a second under-test register, RegUT(2) as shown at 162. Further for purpose of example, the first DUT-stimulating signal 121 is shown to be one that commands the DUT 160 to "Read" its internal, first under-test register 161 (RegUT(1)) and to place the result of the read operation onto return channel 114 at time period t2. The returned result is denoted as a first response signal 131 present on channel 114 during time period t2.

Further during the second time period, t2, the first response signal 131 that is sent to the ATE system 110 via channel 114 is received and validated by the ATE. In doing so, the ATE executes the second line of pseudocode shown at 115b. In the illustrated example, the response validation script encoded at 115b instructs the ATE system 110 to verify that the data 131 then presented over channel 114 equals an expected Response_#1 value. If this validation statement is found to be false, the response validation script encoded at 115b instructs the ATE system 110 to invoke a corresponding Error flagging routine, ERROR(1). As should be apparent, the expected Response_#1 value corresponds to a signal that was earlier loaded into the first under-test register 161 (RegUT(1)). If the DUT 160 correctly stored that earlier sent signal and the DUT correctly responded to the first DUT-stimulating signal 121 of time t1, then at time t2, the first response signal 131 on channel 114 will represent a return of the earlier generated, Response_#1 value as stored in the first under-test register 161 (RegUT(1)).

While the first response signal 131 is coming back during time period t2 and over response channel 114, the stimulus-carrying channel 113 is blocked from sending a next stimulus signal. Any one or more of a number of reasons could explain why stimulus channel 113 is disabled during time period t2. In one embodiment, the stimulus channel 113 and response channel 114 are time multiplexed through a single serial interface 112 and as a result, the signaling of only one of these plural channels can pass through interface 112 at a given time. In an alternate or same embodiment, the DUT 160 is limited by its interface capabilities such that the DUT 160 can be either in a stimulus receiving mode or a response outputting mode but not both at the same time for channels 112 and 113. In an alternate or same embodiment, the ATE 110 is limited by its program execution capabilities such that the ATE 110 can be either in a stimulus outputting mode or a response validating mode but not both at the same time for channels 112 and 113. As a result of one or more of these, or other reasons, a time gap or delay of substantial duration 141 (also denoted as delay-1s) is interposed between the end of the first DUT-stimulating signal 121 and the start of the second DUT-stimulating signal 122. For the same reason(s), a further substantial time gap or delay-2s (142) is interposed between the end of the second DUT-stimulating signal 122 and the start of a successively following, third DUT-stimulating signal 123, and so on (143). Similar substantial delays 144, 145, etc., are interposed between successive response signals 131, 132, 133 and so on.

It is assumed that the DUT 160 can receive stimuli such as 121, 122, 123, etc., at a much faster rate than indicated by the schematic illustration of the spaced apart signals 121-123; and that, but for; the imposition of the inter-stimuli delays 141, 142, 143, etc., the stimulus-carrying channel 113 can deliver the successive stimuli signals at the full receipt speed (specified maximum input rate) of DUT 160. Similarly, it is assumed that the DUT 160 can output successive responses such as 131, 132, 133, etc., at a much faster rate; and that, but for; the forced inclusion of the inter-response delays 144, 145, etc., the response carrying channel 114 can successfully absorb the successive response signals at the full output rate (specified maximum output rate) of DUT 160.

Thus, it is the interspersing of the substantial delays 141-145 between respective stimulus and/or response signals 121-123, 131-133 that prevents the illustrated ATE setup 100 from stressing the DUT 160 at rates extending up to the maximum specified input and output rates of the DUT 160. In other words, the DUT 160 is not being tested at full speed and/or at rates slightly below full speed to see if a failure mode can be induced in that speed range.

The inability to test the DUT at full speed or slightly below is undesirable. Various failure modes can crop up when the under-test DUT 160 is later operated at full or near full speed in a non-test, real use situation. Because the test setup 100 is constrained by the interspersed delays 141-145, the test setup 100 is not able to invoke and detect such full or near-full speed failure modes. Examples of various failure modes that may be missed by setup 100 include buffer-overruns, buffer-underruns, and inter-burst recovery problems.

With respect to potential buffer-overruns, it is possible that inter-stimulus delays such as 141-143 are cushioning one or more input FIFO buffers (not shown) within DUT 160 from experiencing input data overruns. This is a condition where the input data rate into a FIFO is higher than the FIFO output rate and as a result data piles in the FIFO to the point where incoming data overwrites and destroys not-yet-sent output data. It is failure mode. The test setup 100 should be able to find out whether such overruns can occur within DUT 160, and if so, whether the DUT can recover gracefully from such situations. However, because of the presence of the inter-stimulus delays 141-143, the test setup 100 may not be able to force such buffer stressing conditions.

Similarly, with respect to potential buffer-underruns, it is possible that inter-response delays such as 144-145 are cushioning one or more output FIFO buffers (not shown) within DUT 160 from experiencing output data underruns. This is a condition where the output data rate of a given FIFO is higher than the FIFO input rate and as a result, the data output pointer within the FIFO runs out of valid output data and starts pointing to invalid data areas within the FIFO as data that is to be next sent out. It is failure mode. The test setup 100 should be able to find out whether such underruns can occur within DUT 160, and if so, whether the DUT can recover gracefully from such situations. However, because of the presence of the inter-response delays 144-145, the test setup 100 is not able to force such buffer stressing conditions.

With respect to interburst noise problems, these can occur when the presence of noise leads to a retransmission of some signal packets or the like during transmission of a data stream at close-to-saturation rates. The DUT may be inadvertently protected from exhibiting interburst noise and recovery problems due to the lengths of the undesirable delays 141-145, etc. interspersed between the stimuli signals 121-123, etc. and/or the response signals, 131-133, etc.

Figure 2:
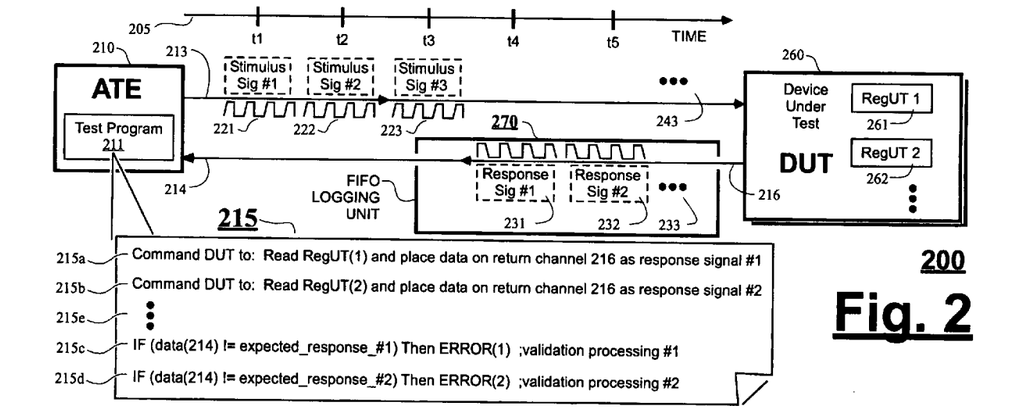
FIG. 2 is a schematic diagram of a modified ATE setup which uses un-paired stimulus and response scripts.

A possible solution is shown in FIG. 2. Rather than pairing the stimulus-invoking and response validating code lines as is done in section 115 of FIG. 1, in the modified setup 200 of FIG. 2, stimulus-invoking pseudocode lines such as 215a, 215b are bundled together at an upper part of code section 215 and response validating code lines such as 215c, 215d are bundled together at a lower part of code section 215. (Where practical, reference numbers in the "200" century series are used in FIG. 2 to refer to corresponding but not necessarily alike items of the "100" century series of FIG. 1.)

A FIFO logging unit 270 is interposed between the response output channel 216 of the DUT and the response validating input port 214 of the ATE 210. During the time that successive stimuli signals 221, 222, 223, etc. are output on channel 213, essentially no delay develops between them. The corresponding response signals, 231, 232, etc. accumulate in the first-in, first out (FIFO) buffer 270 while the ATE 210 is busy outputting the successive stimuli signals 221, 222, 223, etc.

Then, after an appropriate succession of stimulus invoking, code lines, 215a, 215b-215e have been executed, the responses stored in FIFO 270 are successively unloaded into the ATE for validation by execution of validation code lines, 215c, 215d, etc. As a result, the interspersed delay problems of FIG. 1 are no longer present.

Unfortunately, the bundled code approach (bundled stimulus code approach) of FIG. 2 introduces a new problem; namely, that of maintaining coherence between each of the bundled stimuli-invoking lines 215a, 215b-215e and each of the bundled response-validating lines 215c, 215d-etc. As explained in the introduction, users of ATE systems like 110 or 210 routinely change parts of the stimuli-invoking and response-validating scripts as conditions change. The one-after-next pairing of stimuli-invoking and response-analyzing procedures as shown in section 115 of FIG. 1 has the advantage of providing a physical nexus 119 between each pair of adjacent code lines (e.g., 115a-115b). This simplifies bookkeeping for revisions of test procedure. A user can easily check to make sure that a change to the stimulus sequence above validation line 115b is matched by a corresponding change to the validation line 115b itself so that the validation-expected response (e.g., expected_response_#1) is indeed the response to be expected from a properly operating DUT 160 when stimulated by the stimulus sequence immediately above validation line 115b.

In the case of bundled validation lines such as 215c (FIG. 2) such visual verification is no longer inherently possible. Validation line 215c is positioned among a long list of alike looking validation lines (or validation routines) 215e-215d. Stimulus-invoking line 215a is positioned among a long list of alike looking stimulus-invoking lines (or stimulus-invoking routines such as the bundled continuum through subsection 215e). Under such conditions it becomes difficult to realize that a particular stimulus-invoking line (or routine), say 215a is the last of a stream of stimuli that was used before the corresponding response is validated in line (or routine) 215c. If a change is made to the stimulus sequence above line 215b, the user may not easily realize that a corresponding change needs to be made to validation line (or routine) 215c. Or the user may pick the wrong one of a long list of validation lines 215c-215d, etc. as the one to change. If the necessary change is not made to validation line (or routine) 215c, the unchanged validation line will generate a false positive error when executed. If an unnecessary change is made to the wrong validation line (or routine) 215d, the improperly changed validation line will generate a false positive error when executed.

Another problem with the bundled code approach of FIG. 2 has to do with out-of-order response generation. With the stimulus signals 221-223 coming in so closely packed in succession, it is possible for some types of DUT's 260 to output the corresponding response signals out-of-order into the FIFO logger 270. Although FIG. 2 shows response 231 as having been placed in-order into the FIFO 270 at an earlier time (t4) than the load time of response 232 (t5), it is possible under various conditions for the response sequence in FIFO logger to be reversed. In other words, if out-of-order response generation occurred, DUT 260 will have logged response 231 into FIFO 270 at a later time than response 232. The response signals 231-232, etc. will be out of correct order relative to the sequence in which stimulus signals 221-222, etc. were sent to the DUT. Then, when validation line 215c executes in the ATE and expects to see response signal 231 coming out of the FIFO 270, it will instead see response signal 232 coming out. Validation line 215c will then incorrectly flag an error condition. Similarly, when the next validation line 215d executes in the ATE 210 and expects to see response signal 232 coming out of the FIFO 270, it will instead see response signal 231 coming out and the validation line 215d will also incorrectly flag an error condition (unless of course, responses 232 and 231 are identical by happenstance).

A variety of mechanisms might be responsible for causing DUT 260 to output two or more of its responses to the logging FIFO 270 out-of-order. Under one such mechanism, DUT 260 determines on its own that a noise problem occurred when it first tried to output response signal 231 onto channel 216 and it temporarily abandons the outputting of response signal 231 at that time. Response signal 232 goes out without problem. Then, in order to rectify the failure of the first output attempt for response signal 231, the DUT 260 outputs that signal 231 onto channel 216 at a later time. The later-output, response signal 231 then gets stored out-of-order in FIFO 270. Another possible reason for out-of-order response output might be that DUT 260 operates in a multi-threaded way and various threads contend for limited bandwidth in the device. The thread responsible for outputting response signal 231 loses in an arbitration battle while the thread responsible for outputting response signal 232 does not. As a result, response signal 231 arrives at the input of FIFO 270 after response signal 232.

Figure 3:
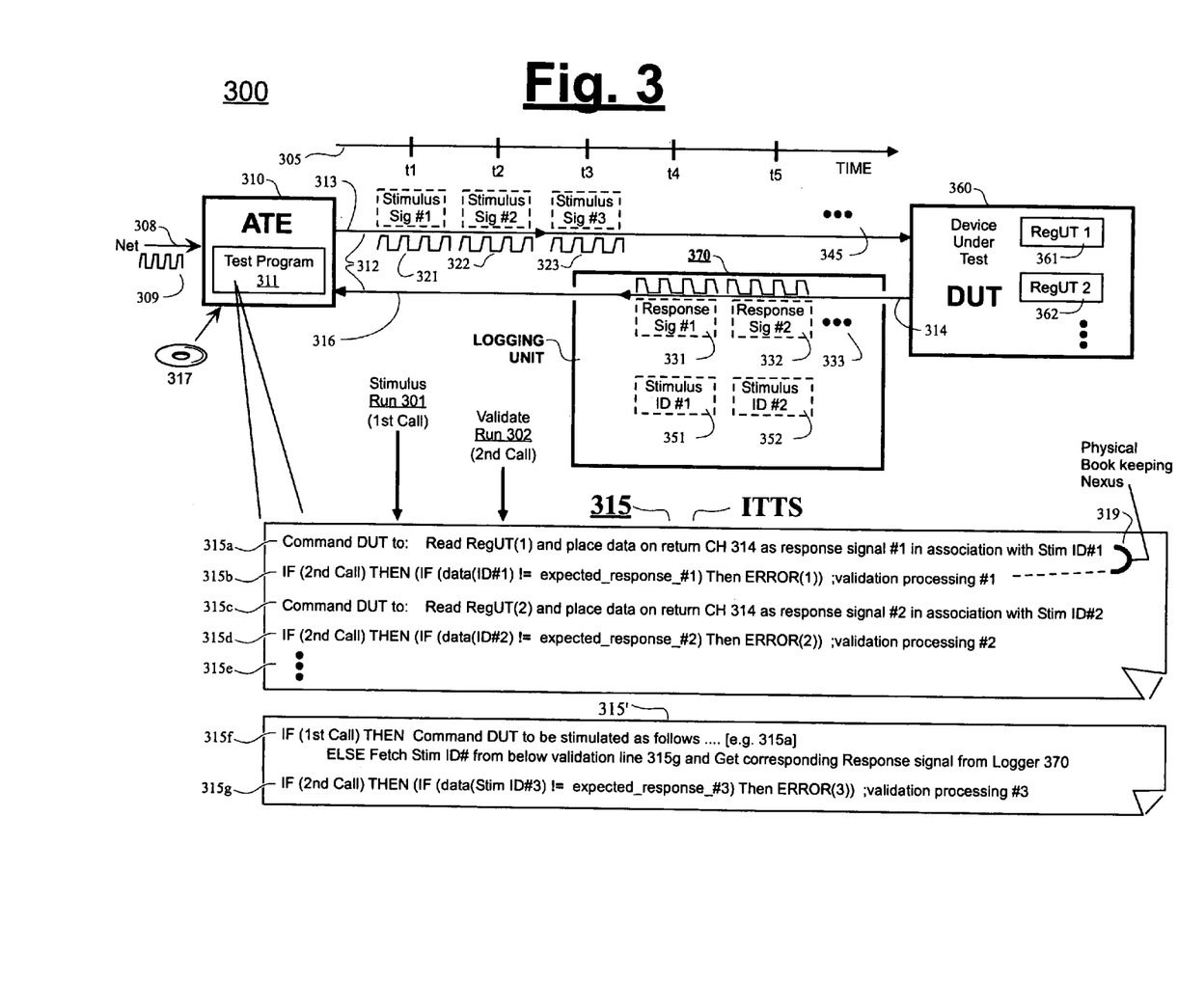
FIG. 3 is a schematic diagram of a first ATE setup in accordance with the invention which uses paired stimulus and response scripts, where the response-validate scripts are conditionally executed.

FIG. 3 is a schematic diagram of an ATE setup 300 in accordance with the invention. Where practical, reference numbers in the "300" century series are used in FIG. 3 to refer to corresponding but not necessarily alike items of the "200" century series of FIG. 2. It may be seen in FIG. 3 that stimulus signals 321-323 are closely packed with no substantial delays between them as they move along channel 313 from ATE 310 to DUT 360. Unlike the case of FIG. 2, the pseudocode section 315 includes an intertwined test specification (ITTS) which pairs corresponding stimulus and response scripts together so that nexus-based bookkeeping 319 may be relied upon for coordinating validation scripts (i.e., 315b) with corresponding stimulus invoking scripts (i.e., 315a). Unlike the case of FIG. 1 though, response-validating scripts such as 315b are conditionally executed. More specifically, the intertwined test specification (ITTS) 315 is stepped through twice. During a first run-through 301 (e.g., 1st Call), a stimulus invoking aspect of the ITTS is executed by ATE 310. During a second run-through 302 (e.g., 2nd Call), a response validating aspect of the ITTS is executed by ATE 310. The intertwined response-validating lines or scripts or routines have conditional headers of a form such as: IF (2nd Call). These conditional headers cause the ATE 310 to bypass execution of the rest of each such conditionally-headed response-validating line/-routine (i.e., 315b) if the stimulus invoking run 301 (1st Call) is being executed at the time. As a result, the intertwined response-validating lines/routines (i.e., 315b, 315d, 315g) do not introduce substantial delays between the generated stimulus signals 321-323, etc. during the stimulus invoking run 301.

On the other hand, when the response validation run 302 (2nd Call) is afterwards executed by ATE 310, the conditional header inquiry, IF (2nd Call), returns a True state in each such conditionally-headed response-validating line/-routine (i.e., 315b, 315d, 315g) and the corresponding validation procedure is executed during the response validation run 302 (2nd Call).

For purpose of introduction, section 315 shows the stimulus invoking lines (or scripts or routines, i.e., 315a, 315c) as being unconditioned. However, if reference is made to the more detailed example of a stimulus invoking line such as at 315f, it is seen that in actuality, the intertwined stimulus-invoking lines (also 315a, 315c, etc.) are also conditionally headed. The conditional header of each stimulus-invoking line may have a form such as: IF (1st Call) THEN Command DUT to be stimulated as follows . . . . where the rest of the line may be of a form such as that shown in line 315a.

As better seen in section 315 of the ITTS, stimulus-invoking line 315a commands the DUT 360 to not only place the response signal on the response-returning channel 314, but also commands or causes the DUT 360 to somehow associate the returned response signal with a unique stimulus identification number (or other unique identifier). In one embodiment, the unique stimulus identifier (i.e., 351) is a unique transmission identification tag that is provided in a transmission packet together with the response signal (i.e., 331). As a result of this association of response with a unique stimulus identifier, the logging unit 370 which records the responses stores not only the DUT-produced, response signals (i.e., 331), but it also associates the stored response signal with the unique stimulus identifier (i.e., 351). Incidentally, the logging unit 370 does not have to be a FIFO. It could be a CAM or other random access memory. In one embodiment, the logical association of a response signal (i.e., 331) with its corresponding stimulus ID number (i.e., 351) occurs by storing the stimulus ID number adjacent to, or at a memory location whose address can be computed from the storage address of the response signal (i.e., 331) using a predefined algorithm (e.g., an offset from a base). In another embodiment, the logical association of a response signal (i.e., 331) with its corresponding stimulus ID number (i.e., 351) occurs by storing the response signal (i.e., 331) at a storage address that logically associates with the stimulus ID number (i.e., such that the stimulus ID# can be computed from the storage address of the response signal using a predefined algorithm). Partial combinations of both techniques could be used for regenerating the stimulus ID#.

Still referring to FIG. 3, the ITTS 315-315' forms part, or all, of the test program that is operatively loaded into memory within ATE unit 310 for execution by that instructable machine means. It is to be understood that the manufactured instructing signals used by the ATE unit 310 and/or another form of instructable machine means (e.g., FPGA's, not yet shown) may originate from one or more sources such as from having been prestored on computer readable media 317 such as a magnetic and/or optical data storage disk or a flash memory stick or other appropriate data storage means; or it may originate in part or whole as one or more propagated electromagnetic signals 309 provided from a signal propagating source such as a computer communications network 308 (e.g., the internet).

Figure 4:
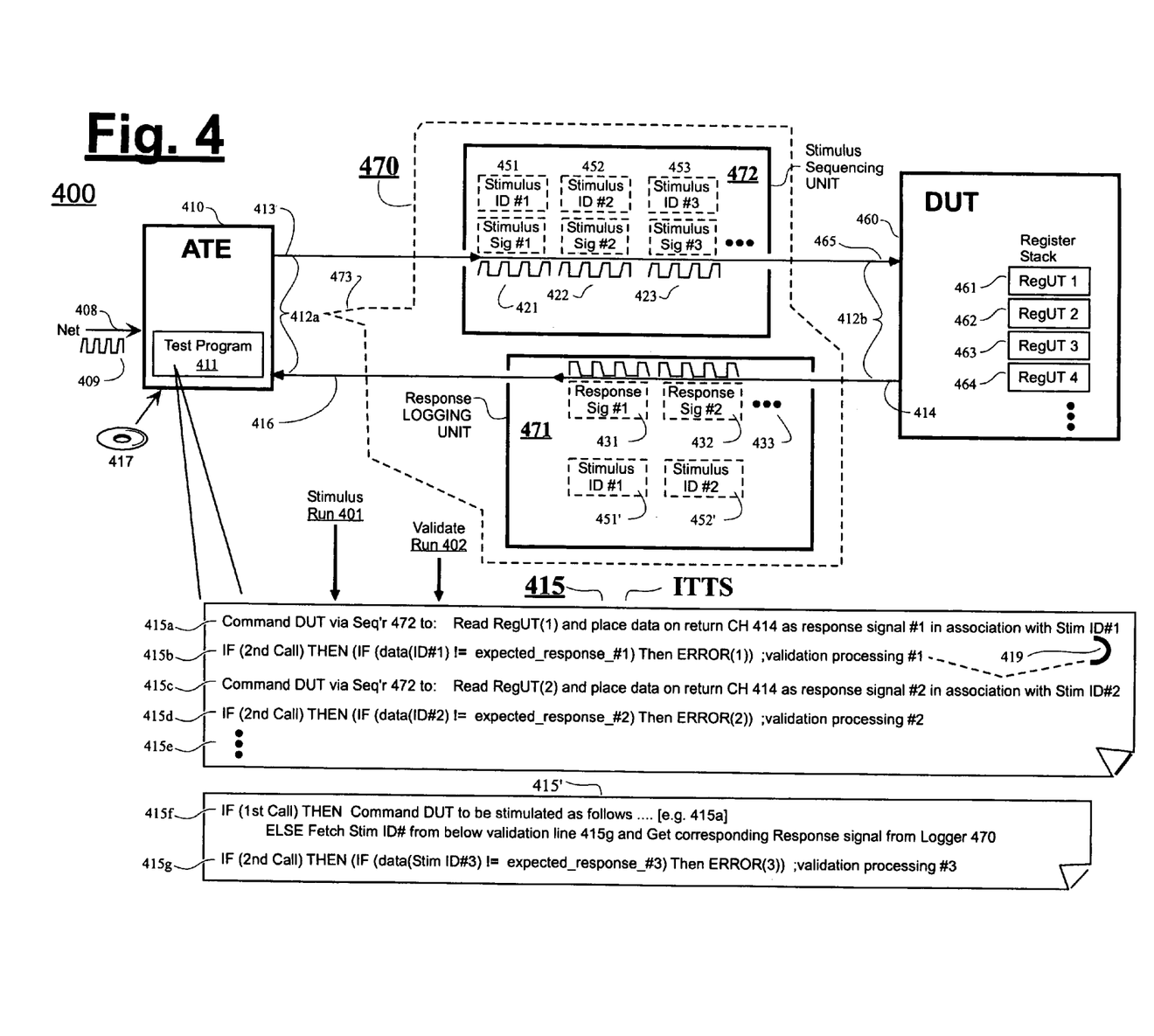
FIG. 4 is a schematic diagram of a second ATE setup in accordance with the invention which includes an interface between the DUT and a core part of the ATE, the interface having a stimulus scripting means and a response logging means.

FIG. 4 is a schematic diagram of another ATE setup 400 in accordance with the invention. Where practical, reference numbers in the "400" century series are used in FIG. 4 to refer to corresponding but not necessarily alike items of the "300" century series of FIG. 3. It may be seen in FIG. 4 that stimulus signals 421-423 are defined by closely packed stimulus scripts stored in a stimulus sequencing unit 472 such that the closely packed stimulus scripts can be sequentially supplied to input port 465 of DUT 460 in a manner where no substantial delays will occur between the successive stimulus signals 421-423 as they are sent to input port 465 of DUT 460. Data stored within the stimulus sequencing unit 472 is arranged such that the successive stimulus signals 421-423 will be logically associated with corresponding and unique stimulus identification numbers (or other ID indicators) 451-453. In one embodiment, the logical association of a stimulus signal (i.e., 421) with its corresponding stimulus ID number (i.e., 451) occurs by storing the stimulus ID number adjacent to, or at a memory location whose address can be computed from the storage address of the stimulus signal (i.e., 421) using a predefined algorithm (e.g., an offset from a base). In another embodiment, the logical association of a stimulus signal (i.e., 421) with its corresponding stimulus ID number (i.e., 451) occurs by storing the stimulus signal (i.e., 421) at a storage address that logically associates with the stimulus ID number (i.e., such that the stimulus ID# can be computed from the storage address of the stimulus signal using a predefined algorithm). Unlike the case of FIG. 3, the ATE 410 does not directly command the DUT 460. Instead, the ATE 410 loads sequential stimulus signals 421-423 into the stimulus sequencing unit 472, and then at a predetermined, appropriate moment instructs the sequencing unit 472 to apply the sequence of stimulus signals 421-423 to the DUT. The applied sequence of stimulus signals 421-423 may be accompanied by their corresponding stimulus ID defining signals 451-453 as they enter input port 465 of the DUT. Just as in the case of FIG. 3, the response logging unit 471 records corresponding response signals 431, 432, etc. in logical association with their respective stimulus ID numbers 451', 453', etc. During the validation run 402, the ATE 410 fetches the logged response signals 431-432 in accordance with their respective stimulus ID numbers 451', 453', etc. and tests them for validity.

In one embodiment, the stimulus sequencing unit 472 is provided in close combination with the response logging unit 471 such as within a same monolithic integrated circuit 470 (e.g., an FPGA) or on a same interface board (also denotable as 470) so that such packaging 470 is interposed between the DUT 460 and a core portion 410 of the ATE equipment. The combination in module 470 of the logging unit 471 and the stimulus sequencing unit 472 may be provided near a midpoint of the test harness 412a-412b or located at either the DUT-adjacent end 412b or the ATE core end 412a of the harness as may be convenient or practical in a given situation. Extension 473 is indicative of one possible embodiment where the logger/sequencer combination 470 is placed on a DUT interfacing board within the core portion 410 of the ATE equipment.

Figure 5:
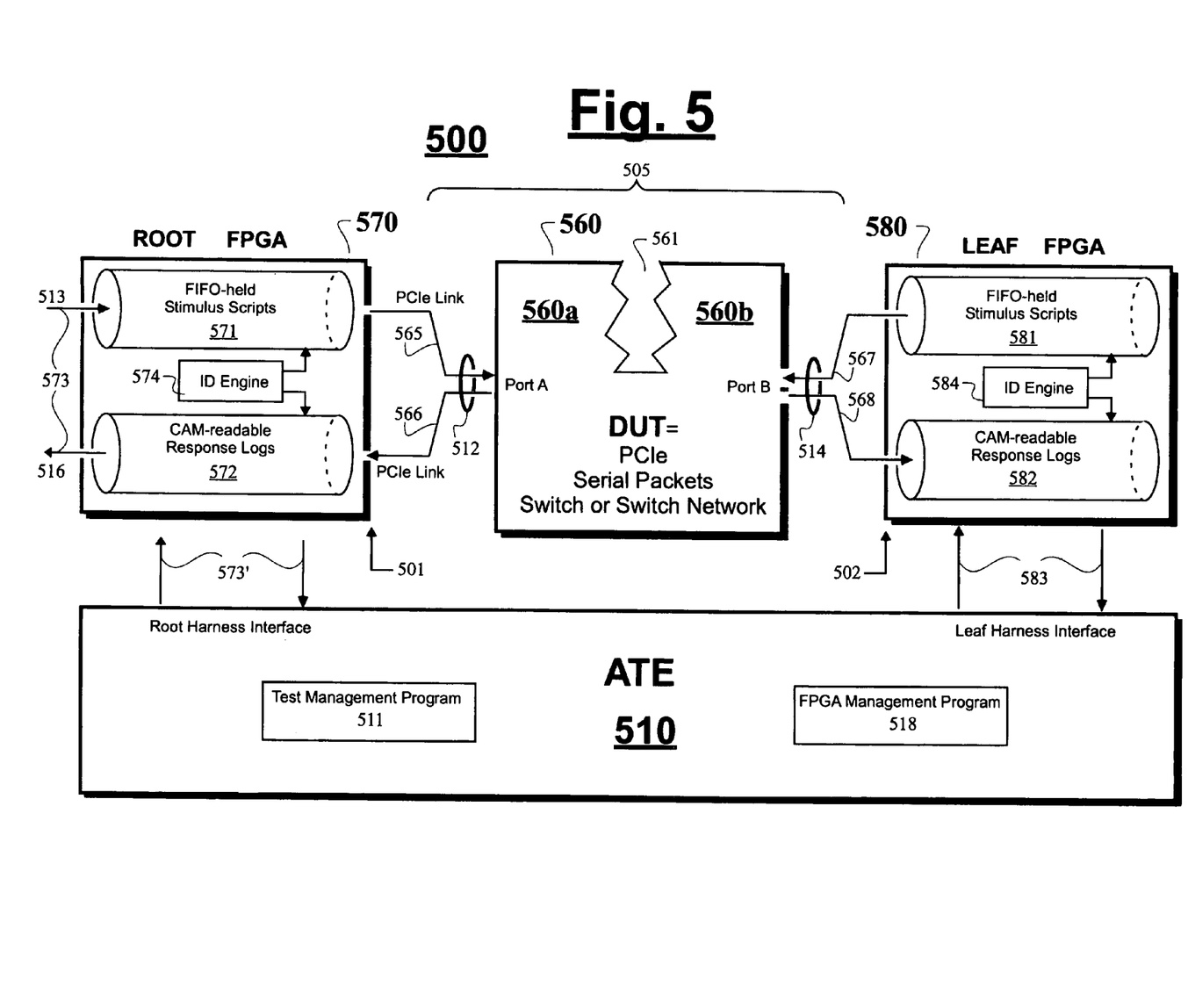
FIG. 5 is a schematic of a PCI-express system (PCIe system) having plural FPGA's acting as stimulus sequencers and response loggers at root and leaf nodes of a PCIe communications network under test.

FIG. 5 is a schematic diagram of a further ATE setup 500 in accordance with the invention. Where practical, reference numbers in the "500" century series are used in FIG. 5 to refer to corresponding but not necessarily alike items of the "400" century series of FIG. 4. The illustrated ATE setup 500 comprises two field programmable gate arrays (FPGA's) 570 and 580 respectively disposed at a root node 501 and a leaf node 502 of a PCI-express communication system (PCIe system) 505. A short background on PCI-express systems is first provided before proceeding further with FIG. 5 because PCIe systems are relatively new in the art.

The PCI bus is a well known form of standardized signal interchange within the field of digital computer and communication system design. One lesser known extension of the PCI bus standard is referred to as PCI-X. An emerging, but not as yet, well known extension of these is referred to as PCI-Express. The three should not be confused with one another. One particular aspect of the present disclosure is directed to the industry-defined, PCI-Express protocol and the fact that it uses bidirectional serial data links for switched exchange of digitized packets through multiport switches. It is sometimes desirable to test the operability of these multiport switches and of the serial links that form communications paths between the switches as well as the operability of leaf node devices and of the root host.

PCI-Express may be characterized by its use of high speed serial links and its use of packets that are structured to transfer device commands and payload data in error free manner through such high speed serial links. Like other communication standards, the PCI-Express protocol has a layered architecture that can be viewed as including: (1) a Physical signaling layer, (2) a Data link layer and (3) a Transaction layer. The Physical signaling layer of PCI-Express is typically characterized by use of a Low-Voltage Differential Signaling (LVDS) high-speed serial interface specified for 2.5 GHz or higher signaling, while further using 8B/10B or like link encoding and using AC-coupled differential signaling. A complementary set of LVDS pairs is called a lane. The PCI Express standard allows for lane combinations so as to form wider communication ports (or links), designated as x1, x2, x4 and so on up to x32. Thus multi-lane links can provide higher bandwidth than can a comparable single lane link. The Data link layer of the PCI-Express protocol is typically characterized by packet exchange standards that govern how packets route between neighboring PCI Express entities and over the single or multi-lane highways while assuring data integrity and providing for sequence checking, along with packet acknowledgments and flow control. The Transaction layer of the PCI-Express protocol is typically characterized by standardized rules for translating data read and/or write requests as they move through switching nodes between an intelligent host and one or more endpoint devices.

There is much to the PCI-Express standard that is beyond the scope of the present disclosure. More information about the standard may be obtained via the internet from the PCI Special Interest Group at: http://www.pcisig.com/specifications.

The PCI-Express standard was initially designed for a single host environment, meaning that it was originally structured to have only one, intelligent host (i.e. a microcomputer or CPU) interfacing with a plurality of less intelligent endpoint devices such as memory units and wired or wireless communication ports. The host was expected to be the one "root" of the PCI-Express network hierarchy tree, while the rest of the tree was formed of branches made of serial links, bridges and switches that provide signal routing (packet routing) between the host and an array of subservient, endpoint devices hanging off the branches as leaf nodes. However, soon after the PCI-Express standard was adopted; the industry developed a desire for multi-hosted networks. In other words, rather than having a single host or "root", designers found it desirable to have multiple intelligent hosts interconnecting with one another and with the various, endpoint devices of the different roots by way of high-speed serial links. PCI-Express was not originally designed for that. However, through minor modifications, it became possible to organize very complex networks with multiple roots. It is desirable to find ways of thoroughly testing such complex networks. Testing should be carried out at full speed. However, as pointed out in the introduction above, and more particularly for FIG. 1, full speed testing of a serial linked DUT may not be possible if substantial delays (i.e., 141-142) are interposed between successive stimulus signals (i.e., 121-123). (Note: Although the network hosts may be referred to herein as being "intelligent" that does not inferentially mean that other devices in the communications system; i.e., switches, have no or lesser intelligence. The various network devices may include programmable processors and software and/or firmware executing in those processors as appropriate.)

Continuing with FIG. 5, the device under test 560 may be a single PCIe switch or a long string of PCIe switches and interposed serial links. If the latter case is true, break 561 represents the intermediate serial links and switches while portion 560*a* represents a root end switch or other such serial interface element; portion 560*b* represents a leaf end switch or other such serial interface element; and item 580 represents a dummy, leaf end device of the PCIe network. If the single switch case holds true, break 561 is not present and 560 is viewed as a single multi-ported switch having at least a first PCIe port designated as Port A and a second PCIe port designated as Port B. The single multi-ported switch will often also have at least one additional Port C and it will provide selective routing between ports A, B and C, but such complication is not necessary for initial understanding of the invention. (In the case where the DUT has additional Ports C, D, etc. it will be understood that additional port-interface modules like 570 and 580 may be operatively coupled to such additional ports, and that these additional port-interface modules will further operatively couple to ATE 510 as may be appropriate.

The root ended Port A of the DUT 560 couples by way of a first serial link (a PCIe link) 512 to a counterpart port provided on port-interface module 570 (FPGA 570) at the root node 501. The root FPGA 570 may include prefabricated PCIe interface means so that separate implementation of such is not needed for practicing the PCIe version of the invention. By way of example, the Xilinx Corporation of California provides a PCIe compatible, bridge device XC2S300E that cross connects with the Xilinx Virtex-II Pro device to define a PCIe compatible solution that can easily further connect to an ATE harness via Ethernet or Inifiniband connections. The leaf ended Port B of the DUT 560 couples by way of a second serial link (a PCIe link) 514 to a counterpart port provided on FPGA 580 (port-interface module 580) at the leaf node 502. The leaf FPGA 580 may include prefabricated PCIe interface means similar to that used in the root FPGA 570.

Prior to a given test run, an FPGA management program 518 stored within ATE unit 510 loads a first succession of stimulus signals into a corresponding, first stimulus holding FIFO 571 that is programmably defined within the root FPGA 570. Such programming of the root FPGA 570 may occur via line 513 of an ATE-to-root harness connection 573/573'. Further, before the given test run, the FPGA management program 518 loads a second succession of stimulus signals into a corresponding, second stimulus holding FIFO 581 defined within the leaf FPGA 580. Such programming of the leaf FPGA 580 may occur via an ATE-to-leaf harness connection 583. The programmably defined, stimulus-holding FIFO's, 571 and 581, are further configured to sequentially output their respective stimulus signals onto respective PCIe channels 565 and 567 in accordance with PCIe protocol rules. Channels 565 and 567 are respectively defined in the Port A PCIe serial link 512 and in the Port B PCIe serial link 514.

Additionally, the FPGA management program 518 configures respective ID assigning engines 574 and 584 in respective FPGA's 570 and 580 to embed unique identifications within or adjacent to the pre-scripted stimulus signals stored in FIFO's 571 and 581. In one embodiment, the ID assigning engines 574 and 584 include cooperative counters that initialize at different points of a count-up range (i.e., at zero and at midway) and sequentially count up in wrap around fashion while embedding successive ones of their counts in "tag" portions of output packets (see field 651 of FIG. 6A). This generally assures that unique ID's will be assigned to respective stimulus signals output from root FPGA 570 and leaf FPGA 580 even if the respective FPGA's 570 and 580 are simultaneously outputting stimulus signals from their respective stimulus sourcing FIFO's 571 and 581.

Prior to the given test run, the FPGA management program 518 additionally configures respective, response logging memories 572 and 582 to be implemented in respective FPGA's 570 and 580 for receiving response signals on a first-in, first stored basis from respective PCIe channels 566 and 568. Channels 566 and 568 are respectively defined in the Port A PCIe serial link 512 and in the Port B PCIe serial link 514. In one embodiment, response logging memories 572 and 582 are configured to have CAM read features so that stored response data may be accessed on a content addressable basis, or more specifically, so that stored response data may be fetched by supplying a corresponding unique stimulus identification. Rather than configuring the FPGA's with the FPGA management program 518, in an alternate embodiment, FPGA's 570 and 580 are programmably configured by external programming means to implement the script-loaded FIFO's, 571 and 581, the response logging and CAM-readable memories, 572 and 582, and/or the unique identification generating engines, 574 and 584.

During the given test run, a test management program 511 stored within the ATE unit 510 triggers the root-ended, stimulus sourcing FIFO 571 to sequentially output its stimulus signals via channel 565 into Port A of the DUT 560. At the same or a slightly different time, the test management program 511 triggers the leaf-ended, stimulus sourcing FIFO 581 to sequentially output its stimulus signals via channel 567 into Port B of the DUT 560. At the same or a slightly later time, the test management program 511 triggers the root and leaf-ended, response logging FIFO's, 572 and 582 to begin logging respective responses received via PCIe serial links 512 and 514. The identification engines, 574 and 584 may be activated at this time to assure that received responses are properly associated, logically with corresponding stimulus identifications. This triggering of the stimulus sequencers, 571 and 581, corresponds to the stimulus run or 1st Call 401 in FIG. 4. of the intertwined test specification (ITTS) 415-415'.

After (or during) the given test run, the test management program 511 begins to fetch logged response signals from the respective logging memories, 572 and 582, and begins to validate these logged response signals against expected response patterns. This fetching of responses from the CAM-readable, logging memories, 572 and 582, corresponds to the validation run or 2nd Call 402 of the intertwined test specification (ITTS) 415-415' as shown in FIG. 4. Because responses are fetched from the CAM-readable, logging memories, 572 and 582, in accordance with their stimulus ID's (see 451'-452' of FIG. 4), the possibility of the DUT 560 outputting responses out-of-order relative to its receipt of the scripted stimulus signals, is not a problem.

In PCIe-based, serially linked systems (i.e., 505) there are at least two different kinds of possible communications. One is where the root device (570) sends a one-way message to a leaf device (580) via the network and expects nothing to come back. A second is where the root device (570) sends a reply-requesting message to a leaf device (580) and expects a corresponding reply signal to come back via the network. An example of the second kind of messaging is a memory read operation. Assume that leaf device 580 contains an addressable memory (other than the illustrated memory means 581-582) and that root device 570 wishes to read specific contents of that addressable memory. In such a case, root device 570 would send one or more request packets through the switch or switch network 560 that identify leaf device 580 as the message destination (as the responding device within the network). When the identified responder 580 receives the request, it sends back data-containing response packets, via the network 505, where the response packets identify root device 570 as the requestor.

There is yet another kind of communication that can take place within PCIe-based, serially linked systems such as 570-505-580. The intelligent host (570) at the root node 501 of the network can send status requests and/or reconfiguration commands to addressed ones of switching devices (i.e., 560) within the network. One such status request is a register read command. A given switching device (i.e., 560) within the network may contain a plurality of status or command registers as is better shown at 461-464 in FIG. 4. One test of network integrity and operability may include a pre-loading of one or more registers within switching device 560 with predefined content and then validating the loads by performing register read operations. This will be further detailed when FIG. 6A-6B are discussed below.

In order to fully test the operability of switching device/network 560, the ATE 510 may be programmed to carry out any combination of one or more of the following test operations: (1) send one or a stream of stimulus signals from FIFO 571 into Port-A and validate that a correct set of responses were returned from Port-A into logging memory 572; (2) send one or a stream of stimulus signals from FIFO 571 into Port-A and validate that a correct set of responses were returned from Port-B into logging memory 582; (3) send one or a stream of stimulus signals from FIFO 581 into Port-B and validate that a correct set of responses were returned from Port-B into logging memory 582; and (4) send one or a stream of stimulus signals from FIFO 581 into Port-B and validate that a correct set of responses were returned from Port-A into logging memory 572. Of course, if device 560 has additional ports C, D, etc. the number of permutations grows accordingly. By using the intertwined test specification (ITTS) scheme 415 of FIG. 4, the ATE setup 500 of FIG. 5 can perform these various test at full speed and without the problems attributed to systems 100 and 200 of respective FIGS. 1 and 2.

Figure 6A:
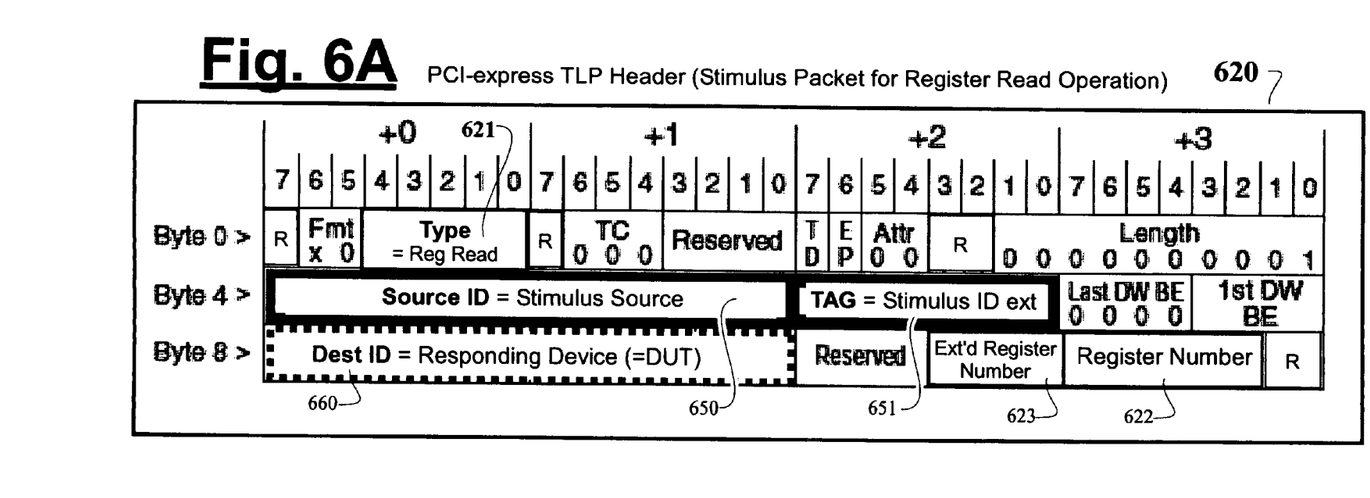
FIG. 6A is a diagram of a first signal structure which may be used in a PCI-express environment for stimulating a register-read operation within a specified device under test (destination DUT)

Referring to FIG. 6A, a diagram is provided of a first propagated signal structure 620 which may be used in a PCI-express environment for stimulating a register-read operation within a specified device under test (destination DUT). Those skilled in the PCIe art will appreciate that FIG. 6A shows the data structure of a TLP header organized by bit and byte address; byte 0 being in the uppermost left corner with its bit number 7 also located in the uppermost left corner. The packet Type field 621 is set to indicate a register read operation. This indicates a particular type among a plurality of different types of stimulus signals to which the DUT may have been subjected. With each different type of stimulus signal, the remaining structure of the packet may differ, for example to include one or more data fields of different lengths as may be appropriate for the type of stimulus. (See for example, data field 631 of FIG. 6B.) The combination of the Source IDentification field 650 and Tag field 651 are used in this embodiment to define a unique stimulus identification value. The Destination ID field 660 points to the responding device, which in this case is the DUT although it does not have to be. The specific register to be read is identified by the register number field 622 and its extension in area 623. The 10 bit Length indicator of the stimulus packet is set at 00 0000 0001 in this illustrated case.

Figure 6B:
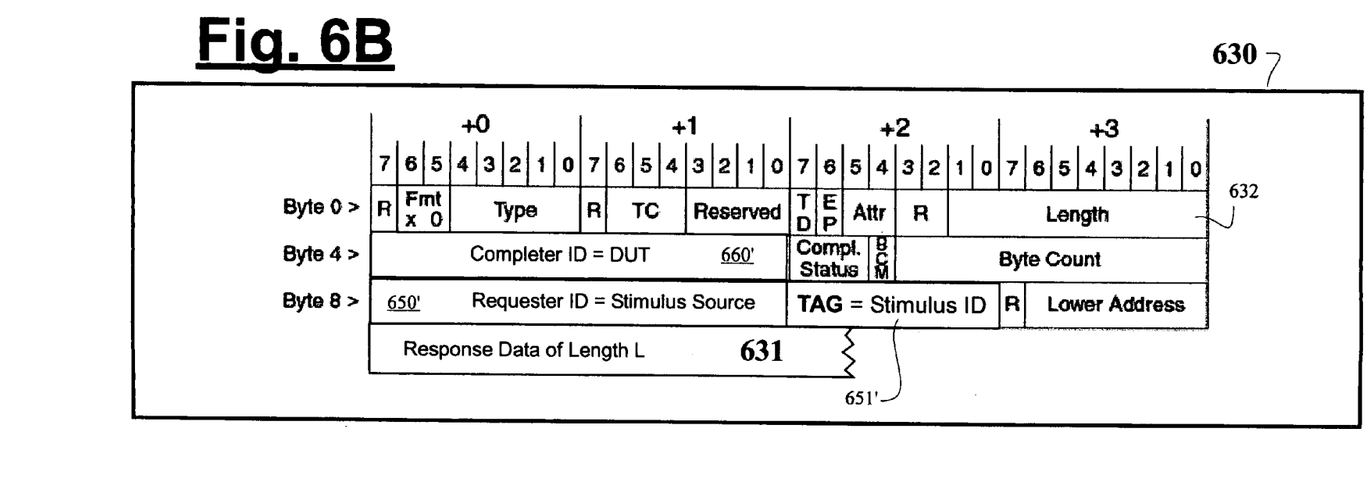
FIG. 6B is a diagram of a second signal structure which may be used in a PCI-express environment for recovering response data and a corresponding stimulus identification tag.

Referring to FIG. 6B, a diagram is provided of a second signal structure 630 which may be used in the PCI-express environment for recovering the response data 631 of the register read operation and of the corresponding stimulus identification tag 650'-651'. The 10 bit Length indicator 632 of the response packet indicates the length of the variable length payload 631. The combination of the Source (Requestor) IDentification field 650' and Tag field 651' are used in this embodiment to define the unique stimulus identification value so as to match up with the stimulus identification value 650-651 established in FIG. 6A. The completer identification field 660' identifies the DUT. During the validation run (e.g., 402 of FIG. 4), the ATE 510 searches through one or both of logs 572 and 582 for the presence of a combined Requestor IDentification field 650' and Tag field 651' that matches the stimulus identification value 650-651 specified by the stimulus invoking line of the intertwined test specification (ITTS) 415. If found, the response data of field 631 of the found packet is compared against the expected response and a validation error is flagged if the comparison indicates an error.

Although FIGS. 6A-6B show manufactured signals that may be used in a PCI-Express environment, where the stimulus ID is embedded in the stimulus and response packets, it is to be understood that present disclosure is not limited to just the PCI-Express environment or to situations where the stimulus ID is embedded in both of the stimulus and response packets. The stimulus signal does not need to carry the stimulus ID code per se and may instead carry an index that causes the DUT (or another device) to associate the proper stimulus ID code with a corresponding response signal. Association of the proper stimulus ID code with the corresponding response signal may include storing the response signal in a memory location whose address is partially or fully representative of the stimulus ID code.

The present disclosure is to be taken as illustrative rather than as limiting the scope, nature, or spirit of the subject matter claimed below. Numerous modifications and variations will become apparent to those skilled in the art after studying the disclosure, including use of equivalent functional and/or structural substitutes for elements described herein, use of equivalent functional couplings for couplings described herein, and/or use of equivalent functional steps for steps described herein. Such insubstantial variations are to be considered within the scope of what is contemplated here. Moreover, if plural examples are given for specific means, or steps, and extrapolation between and/or beyond such given examples is obvious in view of the present disclosure, then the disclosure is to be deemed as effectively disclosing and thus covering at least such extrapolations.

By way of example, it is understood that the configuring of an ATE unit (e.g., 510 of FIG. 5) in accordance with the disclosure can include use of an external computer (not shown) and/or use of one or more data conveying media (e.g., 417 of FIG. 4) and/or use of one or more network conveyed signals (e.g., 409 of FIG. 4) to implement the desired test configuration and generation of prespecified sequences of stimulus signals as well as recovery of the corresponding response signals. Thus, various computer-readable media or other forms of software product or machine-instructing means (including but not limited to, a hard disk, a compact disk, a flash memory stick, a downloading of manufactured instructing signals over a network (e.g., 408) and/or like software products) may be used for instructing an instructable machine (e.g., 510) to carry out such activities. It is therefore within the scope of the disclosure to provide instructing means and to have an instructable machine carry out machine-implemented methods as described herein.

Reservation of Extra-Patent Rights. Resolution of Conflicts, and Interpretation of Terms After this disclosure is lawfully published, the owner of the present patent application has no objection to the reproduction by others of textual and graphic materials contained herein provided such reproduction is for the limited purpose of understanding the present disclosure of invention and of thereby promoting the useful arts and sciences. The owner does not however disclaim any other rights that may be lawfully associated with the disclosed materials, including but not limited to, copyrights in any computer program listings or art works or other works provided herein, and to trademark or trade dress rights that may be associated with coined terms or art works provided herein and to other otherwise-protectable subject matter included herein or otherwise derivable herefrom.

If any disclosures are incorporated herein by reference and such incorporated disclosures conflict in part or whole with the present disclosure, then to the extent of conflict, and/or broader disclosure, and/or broader definition of terms, the present disclosure controls. If such incorporated disclosures conflict in part or whole with one another, then to the extent of conflict, the later-dated disclosure controls.

Unless expressly stated otherwise herein, ordinary terms have their corresponding ordinary meanings within the respective contexts of their presentations, and ordinary terms of art have their corresponding regular meanings within the relevant technical arts and within the respective contexts of their presentations herein.

Given the above disclosure of general concepts and specific embodiments, the scope of protection sought is to be defined by the claims appended hereto. The issued claims are not to be taken as limiting Applicant's right to claim disclosed, but not yet literally claimed subject matter by way of one or more further applications including those filed pursuant to 35 U.S.C. §120 and/or 35 U.S.C. §251.

What is claimed is:

1. A method for testing a device under test (DUT) by subjecting the DUT to a succession of stimulus signals with no substantial delays between said stimulus signals and by validating that acceptable response signals were returned from the DUT, where said lack of substantial delays between the stimulus signals allows the DUT to be tested at or substantially close to a prespecified maximum input rate for stimuli of the DUT, and where said DUT is one of mass produced devices, the method comprising:
   (a) logically assigning unique identifications to respective ones of the stimulus signals in said succession of stimulus signals to which the DUT is subjected with no substantial delays between the stimulus signals of said succession;
   (b) logically associating returned ones of response signals returned from the DUT with corresponding ones of the unique identifications assigned to respective stimulus signals of the respectively returned response signals, wherein logically associating comprises storing said response signals in memory locations used to compute memory locations of corresponding unique identifications; and
   (c) using the unique identifications to access the returned ones of the response signals when validating the returned response signals.

2. The testing method of claim 1 wherein:
the device under test (DUT) includes a first bidirectional serial port though which at least a first adjacent two of said succession of stimulus signals pass when the DUT is being subjected to said succession of stimulus signals; and
corresponding response signals of the first adjacent two stimulus signals either pass through said first bidirectional serial port, or alternatively though a second bidirectional serial port of the DUT if the DUT has such a second bidirectional serial port and the DUT is configured to pass the corresponding response signals though said second bidirectional serial port.

3. The testing method of claim 2 wherein:
the device under test (DUT) includes said second bidirectional serial port and a second adjacent two of said succession of stimulus signals pass through the second bidirectional serial port when the DUT is being subjected to said succession of stimulus signals; and
corresponding response signals of the second adjacent two stimulus signals either pass through said second bidirectional serial port, or alternatively through the first bidirectional serial port depending on how the DUT is configured at the time of said testing.

4. The testing method of claim 1 and further comprising:
   (d) using an intertwined test specification (ITTS) to define said succession of stimulus signals and to define validation procedures to be carried out in validating the corresponding returned response signals of the ITTS defined succession of stimulus signals , where the ITTS comprises:
      (d.1) intertwined stimulus invoking specifications and response-validating specifications.

5. The testing method of claim 4 wherein said ITTS is accessed during each of a response-validating phase and a separate stimulus generating or stimulus specifying phase and wherein:
   (d.2) stimulus invoking actions of the stimulus invoking specifications are executed at least on condition that the ITTS is being accessed during a stimulus generating run or a stimulus specifying run.

6. The testing method of claim 4 wherein:
   (d.2) response validating actions are executed or initialized for execution in accordance with the response-validating specifications on condition that the ITTS is being accessed during a response fetching run or a response fetch and validate run.

7. The testing method of claim 4 wherein:
   (d.2) said stimulus invoking specifications define at least part of said step (a) of logically assigning unique identifications to respective ones of the stimulus signals in said succession of stimulus signals.

8. The testing method of claim 4 wherein:
   (d.2) said response-validating specifications define at least part of said step (b) of logically associating returned ones of response signals returned from the DUT with corresponding ones of the unique identifications.

9. The testing method of claim 4 wherein the intertwined stimulus invoking specifications and response-validating specifications are in physical paired nexus to one another in a corresponding memory that stores the ITTS.

10. The testing method of claim 1 and further comprising:
(d) using programmable response loggers coupled to the DUT to collect said returned ones of response signals returned from the DUT in logical association with corresponding ones of the unique identifications assigned to respective stimulus signals of the respectively returned response signals.

11. The testing method of claim 10 wherein at least one of said programmable response loggers includes a field programmable gate array.

12. The testing method of claim 1 wherein the DUT includes a monolithic integrated circuit.

13. The testing method of claim 12 wherein said monolithic integrated circuit includes a physical signaling layer that provides serial signal interfacing for signals of 2.5 GHz or higher.

14. The testing method of claim 12 wherein said monolithic integrated circuit includes a data link layer that allows for variable link aggregation and thus for serial communication of channel data over a variable number of lanes per channel.

15. The testing method of claim 1 wherein the DUT is part of a packet-based communications network having many similar devices interlinked by physical serial communication links.

16. The testing method of claim 1 wherein the DUT can output responses in an order other than that in which corresponding ones of said stimuli were sent to the DUT.

17. The testing method of claim 1 further comprising sending said stimulus signals over a test harness.

18. A test setup for testing a mass produced device under test (DUT) by subjecting the DUT to a succession of stimulus signals with no substantial delays between said stimulus signals and by validating that acceptable response signals were returned from the DUT, where said lack of substantial delays between the stimulus signals allows the DUT to be tested at or substantially close to a prespecified maximum input rate for stimuli of the DUT, the setup comprising:
(a) first means for logically assigning unique identifications to respective ones of the stimulus signals in said succession of stimulus signals to which the DUT is to be subjected to with no substantial delays between the stimulus signals of said succession; and
(b) second means for logically associating returned ones of response signals returned from the DUT with corresponding ones of the unique identifications assigned to respective stimulus signals of the respectively returned response signals, wherein logically associating comprises storing said response signals in memory locations used to compute corresponding unique identifications.

19. The test setup of claim 18 and further comprising:
(c) response accessing means for accessing returned ones of the response signals by using the unique identifications to reference the returned response signals.

20. The test setup of claim 19 and further comprising:
(d) a first bidirectional serial port though which at least a first adjacent two of said succession of stimulus signals pass when the DUT is being subjected to said succession of stimulus signals; and where
(d.1) corresponding response signals of the first adjacent two stimulus signals either pass though said first bidirectional serial port, or alternatively though a second bidirectional serial port of the test setup if the test setup has such a second bidirectional serial port and the DUT is configured to return the corresponding response signals through said second bidirectional serial port of the test setup.

21. The test setup of claim 20 wherein:
(d.2) the test setup does include said second bidirectional serial port and a second adjacent two of said succession of stimulus signals pass through the second bidirectional serial port when the DUT is being subjected to said succession of stimulus signals; and
(d.3) corresponding response signals of the second adjacent two stimulus signals either pass through said second bidirectional serial port, or alternatively through the first bidirectional serial port depending on how the DUT is configured at the time of said testing.

22. The test setup of claim 19 and further comprising:
(d) an intertwined test specification (ITTS) stored in a memory of the test setup, the ITTS defining said succession of stimulus signals and further defining corresponding validation procedures to be carry out in validating the returned response signals, where the ITTS comprises:
(d.1) intertwined stimulus invoking specifications and response-validating specifications.

23. The test setup of claim 22 wherein said ITTS is accessed during each of a response-validating phase and a separate stimulus generating or stimulus specifying phase and wherein:
(d.2) said stimulus invoking specifications specify a stimulus invoking machine operation conditioned at least on a determination that the ITTS is being accessed during a stimulus generating run or a stimulus specifying run.

24. The test setup of claim 22 wherein:
(d.2) said response-validating specifications specify a response validating machine operation conditioned at least on a determination that the ITTS is being accessed during a response fetching run or a response fetch and validate run.

25. The test setup of claim 22 wherein:
(d.2) said stimulus invoking specifications define at least part of identification assigning operations of said first means (a) when logically assigning the unique identifications to respective ones of the stimulus signals in said succession of stimulus signals.

26. The test setup of claim 22 wherein:
(d.2) said response-validating specifications define at least part of operations of said second means (b) when referencing returned ones of response signals in accordance with corresponding ones of the unique identifications.

27. The testing method of claim 22 wherein the intertwined stimulus invoking specifications and response-validating specifications are in physical paired nexus to one another in the memory that stores the ITTS.

28. The test setup of claim 18 wherein:
(b.1) said second means includes programmable response loggers configured to collect said returned ones of response signals returned from the DUT in logical association with corresponding ones of the unique identifications assigned to respective stimulus signals of the respectively returned response signals.

29. The test setup of claim 28 wherein at least one of said programmable response loggers includes a field programmable gate array.

30. A method comprising automatically causing generation of a manufactured signal for application to a physical device under test (DUT) for thereby stimulating the DUT with a predefined stimulus signal such that after application of the manufactured signal, one or more response signals returned from the DUT can be checked to determine if the response signals are acceptable response signals returned from the DUT in response to said manufactured signal, the manufactured signal including a serially transmitted signal of a frequency of 2.5 GHz or higher and containing:
- (a) a unique stimulus identification that was logically assigned to the predefined stimulus signal such that said unique stimulus identification can later be used to logically associate a correspondingly returned one or more response signals returned from the DUT with corresponding validation algorithms after said manufactured signal has been applied to the DUT to thereby stimulate the DUT, wherein logically assigned comprises storing said stimulus signal in a memory location used to compute a memory location of said unique stimulus identification.

31. The method of claim 30 wherein said manufactured signal further comprises:
- (b) a unique stimulus type field for indicating that the predefined stimulus signal is of a particular type among a plurality of different types of stimulus signals to which the DUT can be subjected.

32. The method of claim 31 wherein said unique stimulus type field indicates a register read operation and said manufactured signal further comprises:
- (c) one or more register identifying fields for identifying one or more registers within the DUT whose contents are to be read in response to said manufactured signal.

33. The method of claim 30 wherein said manufactured signal further comprises:
- (b) a stimulus source identifying field for identifying a source device from which said manufactured signal originated.

34. The method of claim 30 wherein said manufactured signal further comprises:
- (b) a stimulus destination identifying field for identifying the device under test (DUT) to which said manufactured signal is to be applied.

35. A method of receiving a manufactured response signal from a physical device under test (DUT) after the DUT has been stimulated by a plurality of predefined stimulus signals with no substantial delays between said stimulus signals such that, after application of the stimulus signals, the DUT is expected to return one or more corresponding response signals and the returned response signals, of the DUT if any are to be checked to determine if the returned response signals are acceptable response signals returned from the DUT in response to said plurality of predefined stimulus signals, where said lack of substantial delays between the stimulus signals allows the DUT to be tested at or substantially close to a prespecified maximum input rate for stimuli of the DUT, and said method of receiving processes contents of the manufactured one or more response signals received from the DUT where the processed contents of the received one or more response signals include:
- (a) a unique stimulus identification that was logically assigned to the predefined plurality of stimulus signals such that said unique stimulus identification can later be used to logically associate said one or more received response signals with the predefined one or more response validation algorithms after the predefined one or more stimulus signals have been applied to the DUT to thereby stimulate the DUT, wherein logically assigned comprises storing said stimulus signal in a memory location used to compute said unique stimulus identification.

36. The method of claim 35 wherein said processed contents further include:
- (b) a completer identifying field for identifying a response originating device from which said one or more received response signals originated.

37. The method of claim 36 wherein said processed contents further include:
- (c) a stimulus source identifying field for identifying a source device from which said plurality of predefined stimulus signals originated.

38. A method for testing a physical device under test (DUT) with physical stimulus signals, the method comprising:
- transmitting to the DUT a plurality of predefined stimulus signals with no substantial delays between said stimulus signals, where the transmitted stimulus signals are such that after application of the stimulus signals to the DUT, the DUT is expected to return one or more corresponding response signals;
- prior to said transmitting of the plurality of predefined stimulus signals, assigning unique stimulus identifications to the predefined stimulus signals where the assigned unique stimulus identifications identify one or more response validation algorithms to be used after the predefined one or more stimulus signals have been applied to the DUT for validating correspondingly returned response signals;
- processing returned response signals, of the DUT if any so as to thereby produce processed response signals where the processed response signals, if not corrupted include data representing the unique stimulus identifications assigned to their corresponding stimulus signals;
- stepping a second time though the transmitted stimulus signals and fetching their respective one or more response validation algorithms as well as fetching the corresponding processed response signals based on their data representing the unique stimulus identifications; and
- using the fetched one or more response validation algorithms as well as the fetched corresponding processed response signals to determine if the returned response signals are acceptable response signals returned from the DUT in response to said transmitted plurality of predefined stimulus signals.

* * * * *